(12) United States Patent
Sydir et al.

(10) Patent No.: US 7,171,604 B2
(45) Date of Patent: Jan. 30, 2007

(54) METHOD AND APPARATUS FOR CALCULATING CYCLIC REDUNDANCY CHECK (CRC) ON DATA USING A PROGRAMMABLE CRC ENGINE

(75) Inventors: Jaroslaw J. Sydir, San Jose, CA (US); Alok J Mathur, Milpitas, CA (US); Wajdi Feghali, Boston, MA (US); Kamal J. Koshy, Milpitas, CA (US); Eduard Lecha, Fremont, CA (US)

(73) Assignee: Intel Corporation, Santa Clara, CA (US)

(*) Notice: Subject to any disclaimer, the term of this patent is extended or adjusted under 35 U.S.C. 154(b) by 540 days.

(21) Appl. No.: 10/749,128

(22) Filed: Dec. 30, 2003

(65) Prior Publication Data

US 2005/0154960 A1    Jul. 14, 2005

(51) Int. Cl.
*H03M 13/00* (2006.01)
(52) U.S. Cl. ..................................... 714/758
(58) Field of Classification Search ......... 714/757–758
See application file for complete search history.

(56) References Cited

U.S. PATENT DOCUMENTS 5,878,057 A * 3/1999 Maa ........................... 714/757

6,754,870 B2 * 6/2004 Yoshida et al. ............. 714/758
6,938,201 B2 * 8/2005 Goyins et al. .............. 714/805

OTHER PUBLICATIONS

"Intel IXP2400 Network Processor for OC-48/2.5 Gbps network access and edge applications", Product Brief,(2003), 6 pages.
"Intel IXP2800 Network Processor For OC-192/10 Gbps network edge and core applications", Product Brief,(2002), pp. 1-6.

* cited by examiner

*Primary Examiner*—Shelly Chase
(74) *Attorney, Agent, or Firm*—Daly, Crowley, Mofford & Durkee, LLP

(57) ABSTRACT

Configurable CRC calculation engines and methods of performing CRC calculations are presented. The configurable CRC calculation engines calculate a CRC value for the data using an associated polynomial and remainder. The method includes receiving a polynomial, receiving a block of data to determine a CRC value for, and calculating a CRC value for the data using the polynomial. With such devices and methods, the configurable CRC calculation engines are useful in various applications and protocols.

29 Claims, 9 Drawing Sheets

METHOD AND APPARATUS FOR CALCULATING CYCLIC REDUNDANCY CHECK (CRC) ON DATA USING A PROGRAMMABLE CRC ENGINE

CROSS REFERENCE TO RELATED APPLICATIONS

Not applicable

Statement Regarding Federally Sponsored Research

Not applicable

Field of the Invention

The present disclosure relates generally to error detection and, more specifically, to a programmable CRC calculation engine.

BACKGROUND OF THE INVENTION

Computer systems employ a number of techniques for detecting errors that may have been introduced into data during transmission across a network. Commonly, a checksum is calculated over the header and/or body of a packet or frame and is transmitted with the packet or frame. The checksum is a compact representation of the data within the packet or frame. At the receiving end, the same calculation is performed across the header and/or body of the packet or frame and the checksum calculated on the received data is compared with the transmitted checksum. If the calculated checksum matches the received checksum, the data is deemed to be valid. If the received checksum doesn't match the calculated checksum, the data is deemed to have been corrupted.

One of the techniques commonly employed to calculate checksums for use in networking protocols is called Cyclic Redundancy Check (CRC). The CRC is calculated by treating the binary representation of the data across which the CRC is calculated as the coefficients of a polynomial. This polynomial is then divided by a predetermined polynomial of a given size using modulo 2 polynomial arithmetic. The checksum (also referred to as the "residue") is the remainder resulting from this operation.

Specific CRCs are characterized by the size and coefficients of the polynomial that is used as the divisor. A variety of different CRC polynomials of different lengths have been defined. Different networking protocols use a multitude of different CRCs ranging from 5 bits to 32 bits in length. For example, the Ethernet protocol uses a 32-bit CRC polynomial and its CRC is therefore referred to as CRC-32.

Prior art CRC calculation engines typically implement fixed function acceleration units for calculating each specific CRC (for each specific polynomial). For example, a network processor may contain fixed function blocks for five such polynomials, but this still does not cover all of the networking protocols that can be implemented on a network processor. Adding fixed function CRC engines for all of the CRCs used by all of the protocols which might be processed by a network processor may not be a viable option since this approach would be very costly from a die area perspective, for example. As a result, most network processors are aimed at specific networking segments and contain fixed function acceleration hardware for the specific CRCs used by the protocols associated with that networking segment.

BRIEF DESCRIPTION OF THE DRAWINGS

The foregoing features of a configurable CRC calculation engine included as part of a network processor may be more fully understood from the following description of the drawings in which.

DETAILED DESCRIPTION OF THE INVENTION

A configurable CRC calculation engine is presented. Since the CRC calculation engine is configurable, it has use in a wide variety of applications. In a particular embodiment, a network processor contains a pair of configurable CRC calculation engines, which are used to calculate any CRC of length 32 bits or less, with any polynomial. It is understood however that any number of CRC calculation engines can be used. System software specifies the binary coefficients that define the polynomial and the length of the polynomial, and submits the data to be processed using that CRC.

Figure 1:
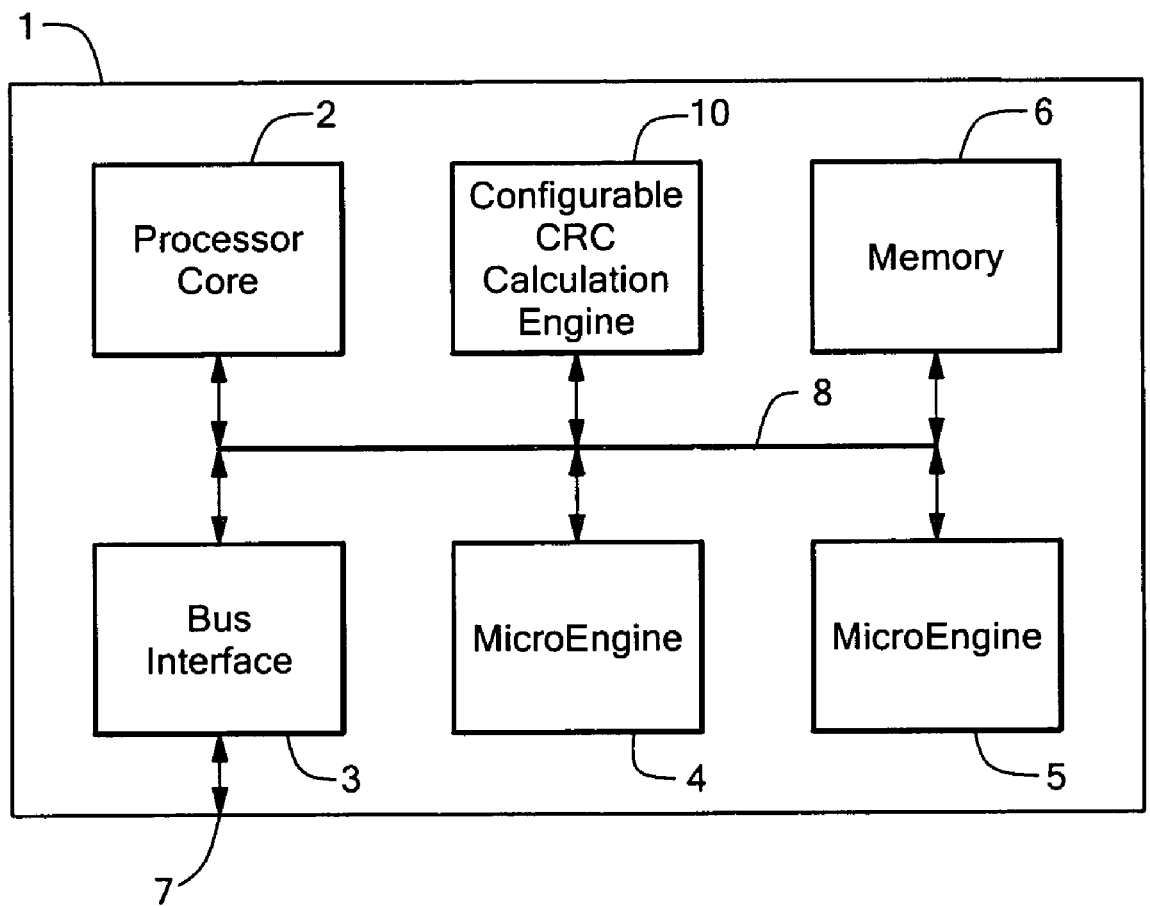
FIG. 1 is a high-level block diagram of a network processor including a configurable CRC calculation engine.

Referring now to FIG. 1, a high-level block diagram of a network processor 1 including a configurable CRC calculation engine 10 is shown. The network processor 1 also includes a core processor 2, a bus interface 3, MicroEngines (MEs) 4 and 5, and a memory 6.

The core processor 2 is responsible for the processing of network packets, and for the management of the other components of the network processor. Bus interface 3 provides the interface between the internal bus 8 and an external bus 7. The internal bus 8 is used by all the network processor components to communicate with each other. For example, the core processor 2 communicates with the memory 6 over bus 8, while ME 4 communicates with the configurable CRC calculation engine 10 over the same internal bus 8.

The MEs 4,5 typically comprise a Reduced Instruction Set (RISC) processor which can perform some of the tasks required by the network processor 1, thereby freeing up the core processor 2 to perform other tasks. Memory 6 is used to store look-up tables and/or to provide temporary packet payload storage. The configurable CRC calculation engine 10, described in detail below, is used to perform CRC calculations for 32 bits or less CRCs on a packet of data.

Figure 2:
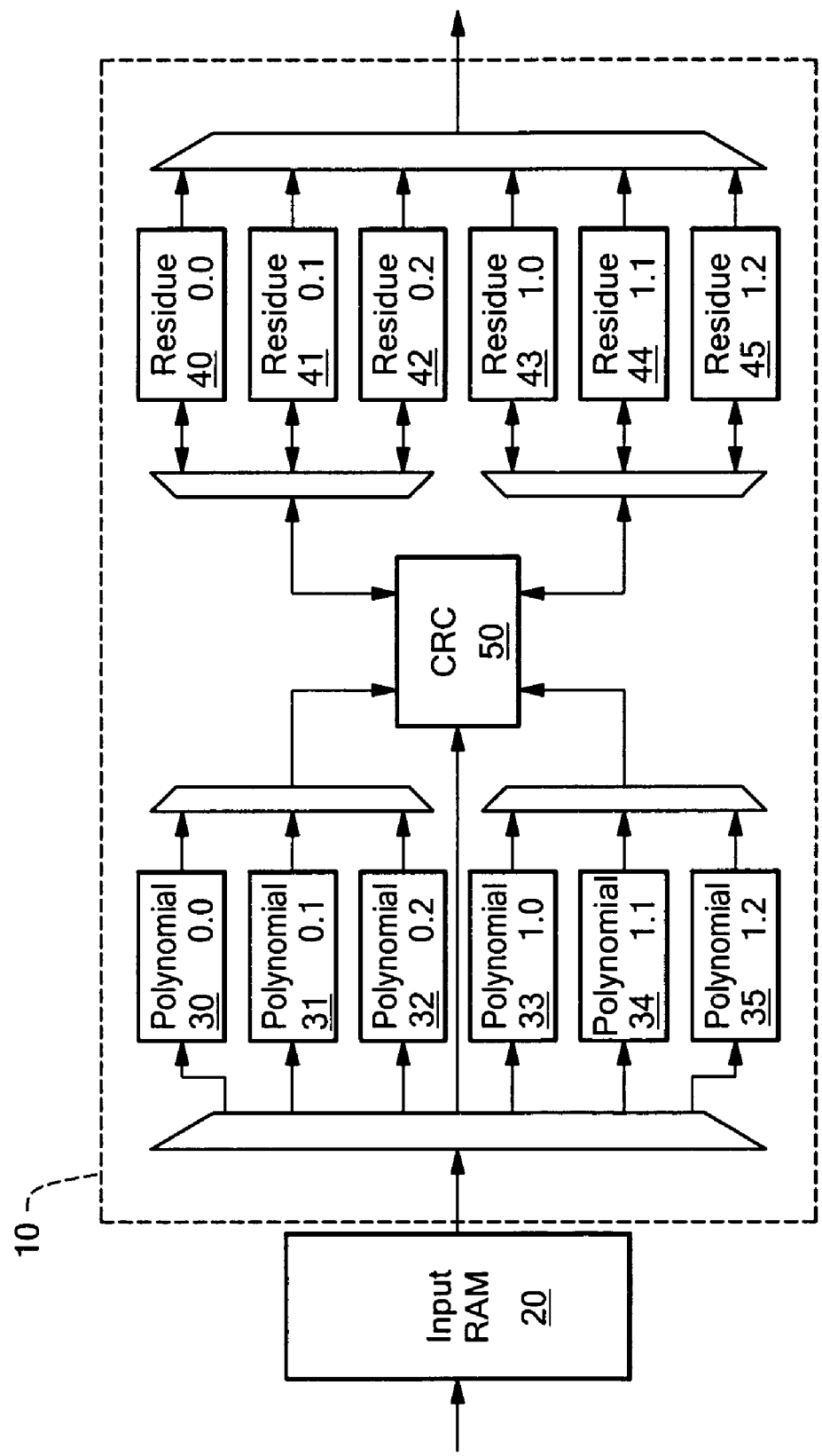
FIG. 2 is a block diagram of the configurable CRC calculation engine.

Referring now to FIG. 2, a block diagram of exemplary configurable CRC calculation engine 10 of FIG. 1 is shown. An input Random Access Memory (RAM) 20 is used to provide temporary storage of the data that is to be processed by the configurable CRC calculation engine 10. While the RAM 20 is shown external to the configurable CRC calculation engine 10, in other embodiments the RAM 20 is incorporated as part of the configurable CRC calculation engine 10.

The configurable CRC calculation engine 10 in this particular embodiment has six processing contexts, designated as context 0,0; context 0,1; context 0,2; context 1,0; context 1,1; and context 1,2. While six processing contexts are shown, it should be appreciated that any number of processing contexts could be used. Stored in each context are the corresponding polynomial 30–35 and the corresponding residue 40–45. The polynomial and residue are loaded into the appropriate context under program control. The CRC unit 50 reads the polynomial and residue from the appropriate context and uses the polynomial and residue to calculate a CRC value of the specified length across data that was loaded into the input RAM 20. The CRC unit 50 writes the modified residue back to the appropriate context. All of these operations occur under program control. A new polynomial can be loaded for each new packet (or block of data), or the set of polynomials that are required by the application can be loaded at initialization time.

An example of how a CRC value is calculated is described below.

A polynomial is selected as a divisor, the polynomial having a width W. As an example the polynomial 1 0000 0111 is selected. This polynomial has a width W of eight since the most significant bit of the polynomial is bit 8 starting from bit 0 and working right to left. Since the polynomial has a width W of eight, this CRC calculation is referred to as a CRC-8 calculation.

The message M for which the CRC is being calculated comprises the data 0101 1100 in this example. To calculate the CRC value for this message M, the message M has a total of eight zeroes appended to the end of it to produce augmented message M'. The eight zeroes are used to augment the original message since the width W of the polynomial is eight. Augmented message M' thus comprises 0101 1100 0000 0000.

This augmented message M' is divided by the polynomial using modulo2 polynomial arithmetic. Modulo arithmetic is used since there is no carry or borrow operations needed, thus making the operation simpler to provide in either hardware or software. The quotient is discarded and the remainder is the CRC value.

```
  0101110000000000     M`
    100000111           (polynomial)
  001110111000000
    100000111           (polynomial)
   0110110110000
    100000111           (polynomial)
    010110001000
     100000111          (polynomial)
     000110010100
       100000111        (polynomial)
       010010011        CRC
```

The calculated CRC-8 value 1001 0011 is then appended to message M, yielding 0101 1100 1001 0011. This data is then transmitted to the receiver. The receiver then performs the same CRC-8 calculation on the first eight bits of the received data (reading from left to right) and compares the result of the CRC calculation to the last eight bits of the received data. If the CRC value calculated by the receiver for the first eight bits of the transmitted data matches the CRC value contained in the last eight bits of the transmitted data, then the data is considered uncorrupted. On the other hand, if the CRC value calculated by the receiver for the first eight bits of the transmitted data does not match the CRC value contained in the last eight bits of the transmitted data, then the data is deemed corrupted. Alternately, the receiver can calculate the CRC value on the entire received data including the CRC value (skipping the appending W zeroes to the original message) and if the result is zero, then the data is uncorrupted, otherwise the data is corrupted.

Performing CRC calculations in software is fairly costly from a processing cycle perspective. A network processor typically contains multiple MEs. A typical ME within a network processor requires a total of five cycles to process each byte of data.

The configurable CRC calculation engine incorporated as part of the network processor has the advantage of performing the CRC calculations at an appropriate rate while being useful for all of the CRCs that may be used in network protocols. Thus, a configurable CRC calculation engine that can handle all 32 bit or less CRCs, is a key component of a truly flexible and programmable network processor.

Figure 3:
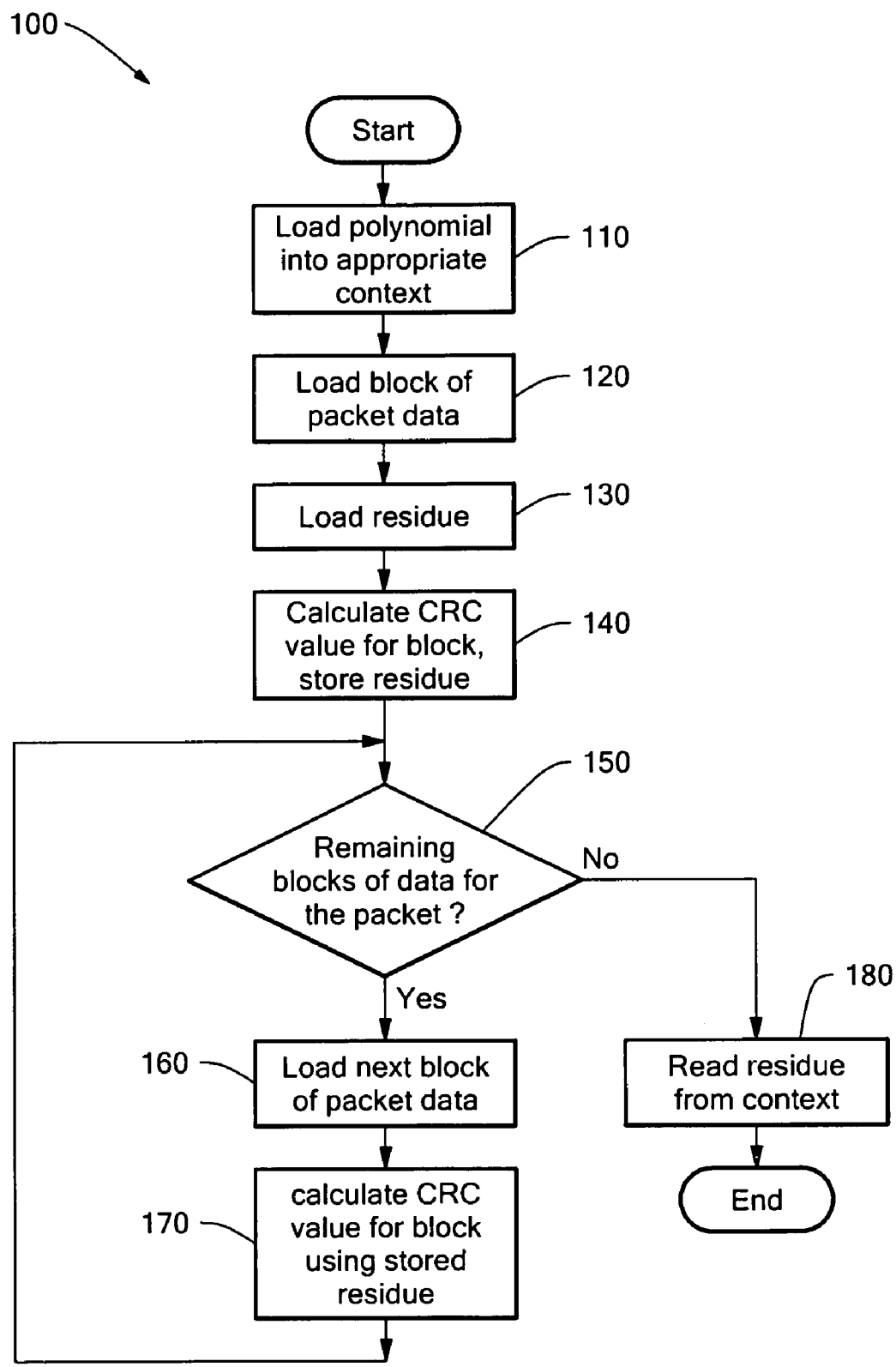
FIG. 3 is a flow chart of the process of performing CRC calculations.
Figure 5:
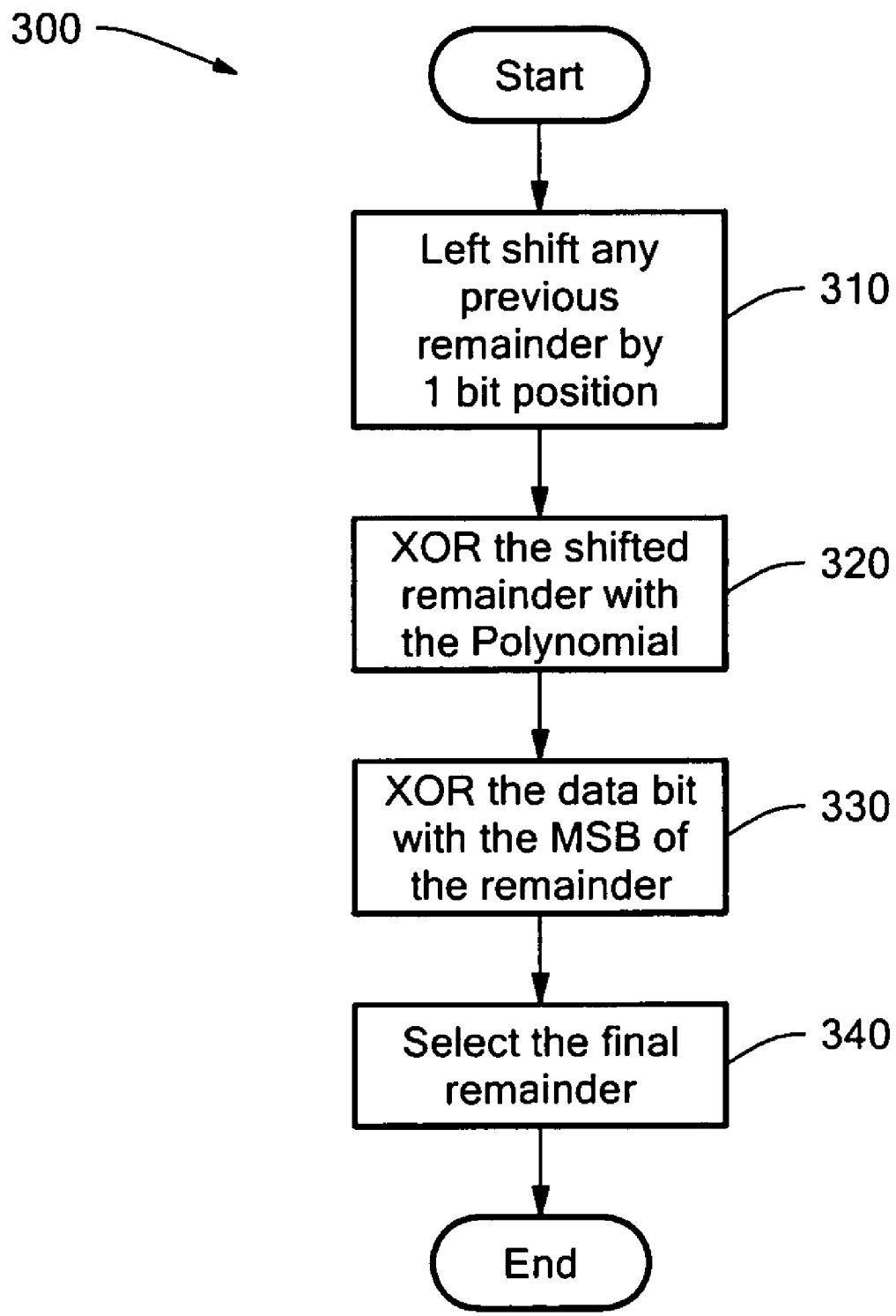
FIG. 5 is a flow diagram of the method of performing CRC calculations using the CRC engine of FIG. 4.

Flow charts of the presently disclosed methods are depicted in FIGS. 3, 5 and 7. The rectangular elements are herein denoted "processing blocks" and represent computer software instructions or groups of instructions. The diamond shaped elements, are herein denoted "decision blocks," and represent computer software instructions or groups of instructions which affect the execution of the computer software instructions represented by the processing blocks.

Alternatively, the processing and decision blocks represent functions performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required in accordance with the present disclosure. It should be noted that many routine program elements, such as initialization of loops and variables and the use of temporary variables are not shown. It will be appreciated by those of ordinary skill in the art that unless otherwise indicated herein, the particular sequence of functions described is illustrative only and can be varied. Thus, unless otherwise stated the functions described below are unordered meaning that, when possible, the functions can be performed in any convenient or desirable order.

The process 100 of performing a CRC calculation using a configurable CRC calculation engine is shown in the flow chart of FIG. 3. The process 100 begins and processing block 110 is executed.

In processing block 110 the appropriate polynomial is loaded into the appropriate context for a given CRC calculation. The CRC calculation engine may be supplied with the predetermined polynomial each time data is loaded into the RAM or may be loaded at system initialization time. The programmable CRC calculation engine may include more than one context.

Processing continues with processing block 120 wherein a block of packet data is loaded into the Input RAM. This is the data that the configurable CRC calculation engine will determine the CRC value for.

In processing block 130 the residue is either loaded or is set of an initial value of 0. Steps 110, 120, and 130 can be performed in any order or can be performed in parallel.

The polynomial and residue are read from the appropriate context for the data in processing block 140. The CRC engine reads the data from the Input RAM, calculates the CRC value for the data, and stores the residue in the appropriate context.

In decision block 150 a determination is made regarding whether there are remaining blocks of data for the packet. If there are additional blocks of data remaining for the packet, then processing block 160 is executed. If there are no remaining blocks of data for the packet, then processing block 180 is executed.

In processing block 160, when there are remaining blocks of data for the packet, the next block of data is loaded into the CRC engine in the same context as the previous block of data.

In processing block 170 the CRC calculation engine determines the CRC value for this block of data. The CRC engine reads the polynomial and residue from the context and the data from the Input RAM. The CRC engine calculates the CRC value across the data using the residue that it reads from the context as the starting value and stores the new residue in the specified context. After completing processing block 170, decision block 150 is executed.

Once there are no more remaining blocks of data for the packet, processing continues at processing block 180 where the residue is read from the context. The residue is the CRC value that has been calculated for the packet of data.

In another embodiment, a CRC is produced by performing calculations on multiple bit-slices. As used herein, a bit-slice processes one bit of data and generates the updated CRC. The bit slices can be concatenated to generate a CRC over multiple data bits. As discussed above, a CRC of polynomial N generates a data CRC (remainder) with N bits.

Figure 4:
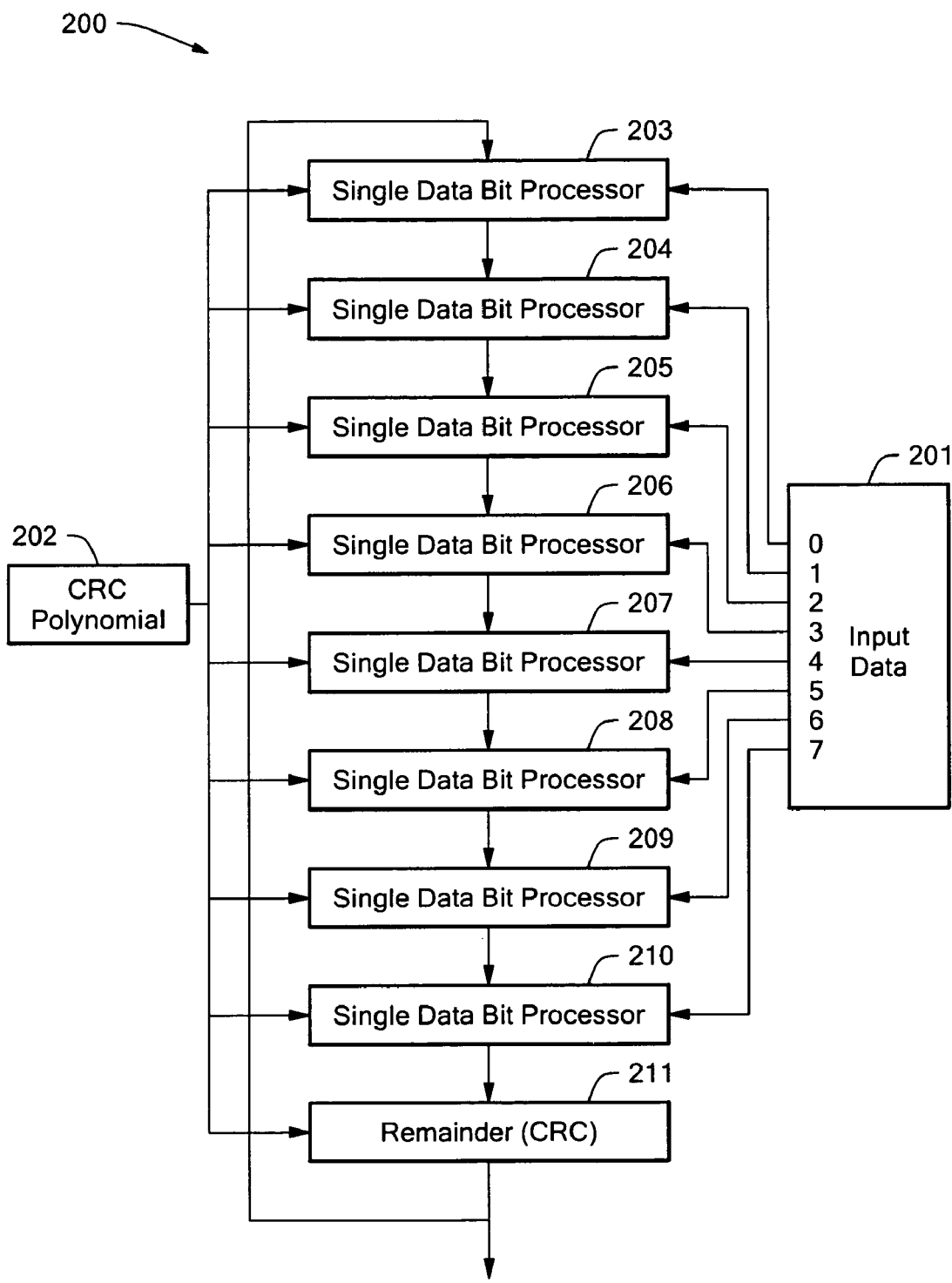
FIG. 4 is a block diagram of an 8-bit CRC engine.

Referring now to FIG. 4, a block diagram of an 8-bit data engine 200 is shown. The 8-bit data engine includes an input data register 201. This data register 201 holds the 8 bits of data that the CRC will be calculated on. The 8-bit data engine 200 also includes a CRC polynomial register 202. This register 202 holds the CRC polynomial.

A total of eight single bit processors 203–210 are included. A single data bit of the input data register is supplied to a single bit processor, as is the CRC polynomial from CRC polynomial register 202. Thus, data bit 0 from input data register 201 is supplied to single bit processor 203, data bit 1 from input data register 201 is supplied to single bit processor 204, etc. The output of a single bit processor is fed to the next single bit processor for single bit processors 203–210. The output of single bit processor 210 is supplied to CRC register 211.

The output of a single data bit processor is fed to next single data bit processor for 8 stages, with the first stage handling least significant (LSB) of the data. The output of the $8^{th}$ stage 210 is then stored in a Remainder (CRC) register 211. This register value is re-circulated as the remainder for next byte of data to single bit processor 203. The CRC register value is also available for reading the latest CRC. This 8-bit engine 200 can process 8-bits of new data every cycle to generate the updated CRC. Each single bit processor performs the exemplary function new_bit_rem described below.

The method of providing programmable CRC requires the CRC polynomial coefficients to be programmed into the engine as a 32-bit word with its N−1 coefficient left aligned to bit 31 of the word. All the lower unused bits are set to '0'. Any last remainder (CRC) is also programmed into the engine as a 32-bit word with most significant bit of the remainder aligned to bit 31 of the word. The lower unused bits are also set to '0'.

The CRC engine is built using multiple single bit data slices, each of which calculates the new CRC after 1-bit of input data, using the following function, referred to herein as the function "new_bit_rem":

```
Line 1: // returns the updated remainder after processing 1 bit of input data
Line 2: function [31:0] new_bit_rem ;
Line 3: input           d ; // input data bit
Line 4: input [31:0]    rem ; // bit 31 is the most significant bit for any size CRC
Line 5: input [31:0]    poly ; // Bit 31 is the most significant bit (N-1) for any size poly
Line 6: reg [31:0]      shf_rem ; // 1-bit shifted remainder in
Line 7: reg [31:0]      masked_shf_rem ; // polynomial XOR'd remainder
Line 8: reg             sel ;   // selects the new CRC value
Line 9: begin
Line 10: shf_rem = {rem[30:0],1'b0} ; // left shift last remainder by 1
Line 11: masked_shf_rem = shf_rem ^ poly ; // XOR the shifted remainder with the polynomial
Line 12: sel = d ^ rem[31] ;              // XOR the new data bit with the MSB of remainder
Line 13: new_bit_rem = sel ? masked_shf_rem : shf_rem ; // Select the final remainder (CRC)
Line 14: end
Line 15: endfunction
```

Lines 1–9 set up and define the registers and variables used to perform the function. The function begins at line 9. At line 10, the remainder from the immediately prior operation is left shifted by 1 bit position. In line 11 the shifted remainder from line 10 is XORed with the polynomial (this in effect performs a division of the shifted remainder by the polynomial). In line 12 the new data bit is XORed with bit 31 of the unshifted remainder. As described above, during the modulo 2 arithmetic, the most significant bit of the polynomial is aligned with the leading "1" of the remainder in order to perform the next operation. In line 13, the result of the function is selected as either the result from line 11 or the result of line 10 based upon the result of line 12. The subtraction of the polynomial from the remainder (line 11) will take place when the data bit is different than the most significant bit of the remainder (line 12), otherwise the remainder is left shifted by one bit (line 10).

The final CRC is aligned to MSB of the 32-bit word, and may need to be shifted right by (32−N) for proper alignment before usage by other parts of the system. The above description utilized a polynomial of order of 32 or less, but the method is generic and can be extended to any size of polynomial e.g., to be able to support polynomial of order 64 or less, a 64-bit word-structure is used in a similar manner.

A flow diagram for the method of performing the function new_bit_rem is shown in FIG. 5. The function starts and processing block 310 is executed. In processing block 310 any previous remainder is left shifted by one bit position.

Processing continues at processing block 320 where the shifted remainder is XORed with the polynomial. Processing continues with processing block 330 in which the single data bit is XORed with the most significant bit (MSB) of the remainder.

Processing block 340 is executed next, wherein the final remainder is selected. As described above, the MSB of the polynomial should be aligned with the leading "1" of the remainder in order to perform the modulo subtraction (XOR function) of the polynomial with the remainder. The subtraction takes place when both the leading bit of the remainder and the polynomial are both "1"s (processing block 320), otherwise the remainder is left shifted a single bit position. The final remainder is thus the result of the subtraction if the MSB of the polynomial and the remainder are both "1"s (the result from processing block 330), or the final remainder is the left shifted remainder (the result of processing block 310). The process then ends.

Figure 6A:
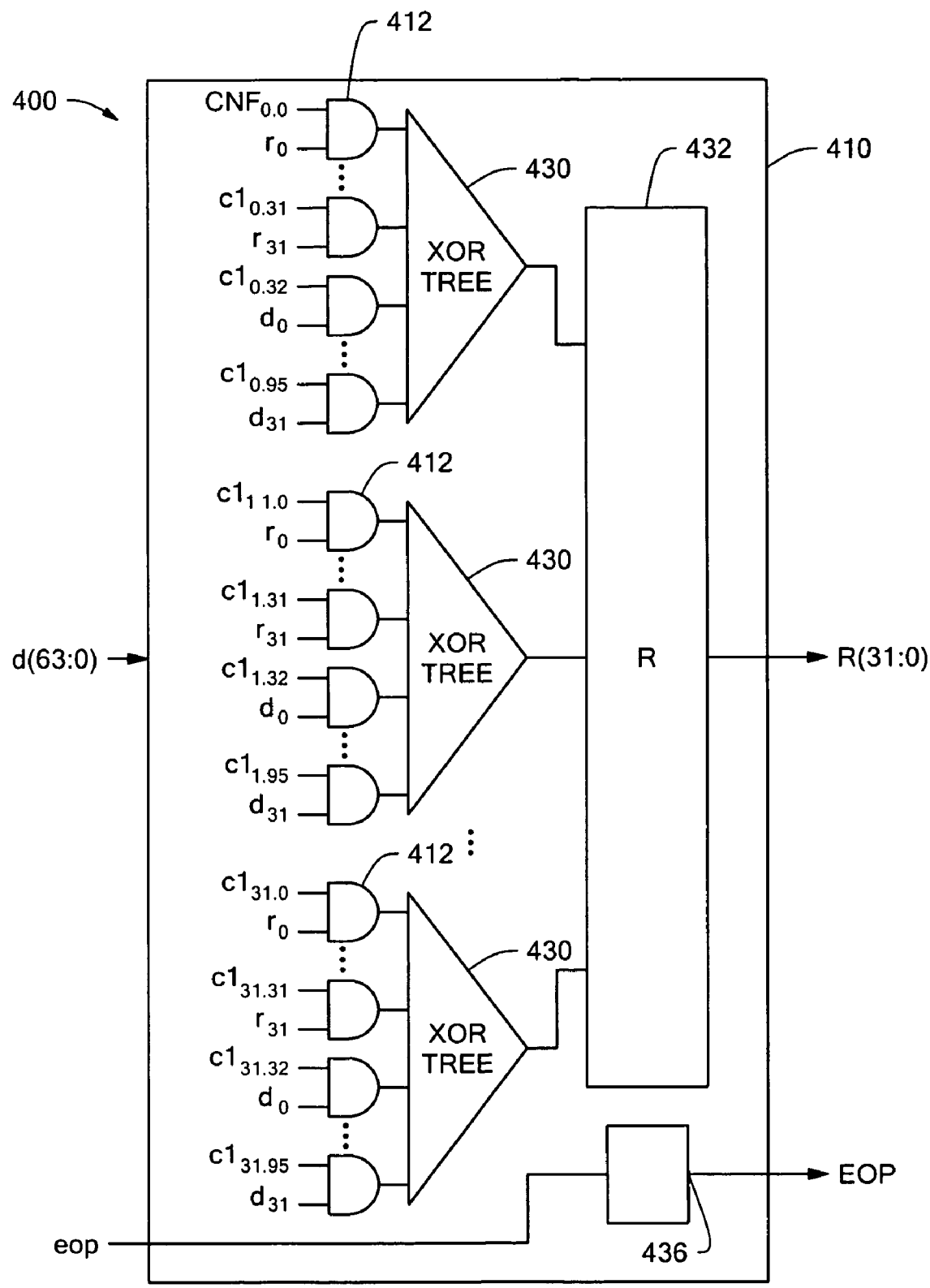
FIGS. 6A and 6B are a block diagram of a two-stage programmable CRC engine.
Figure 6B:
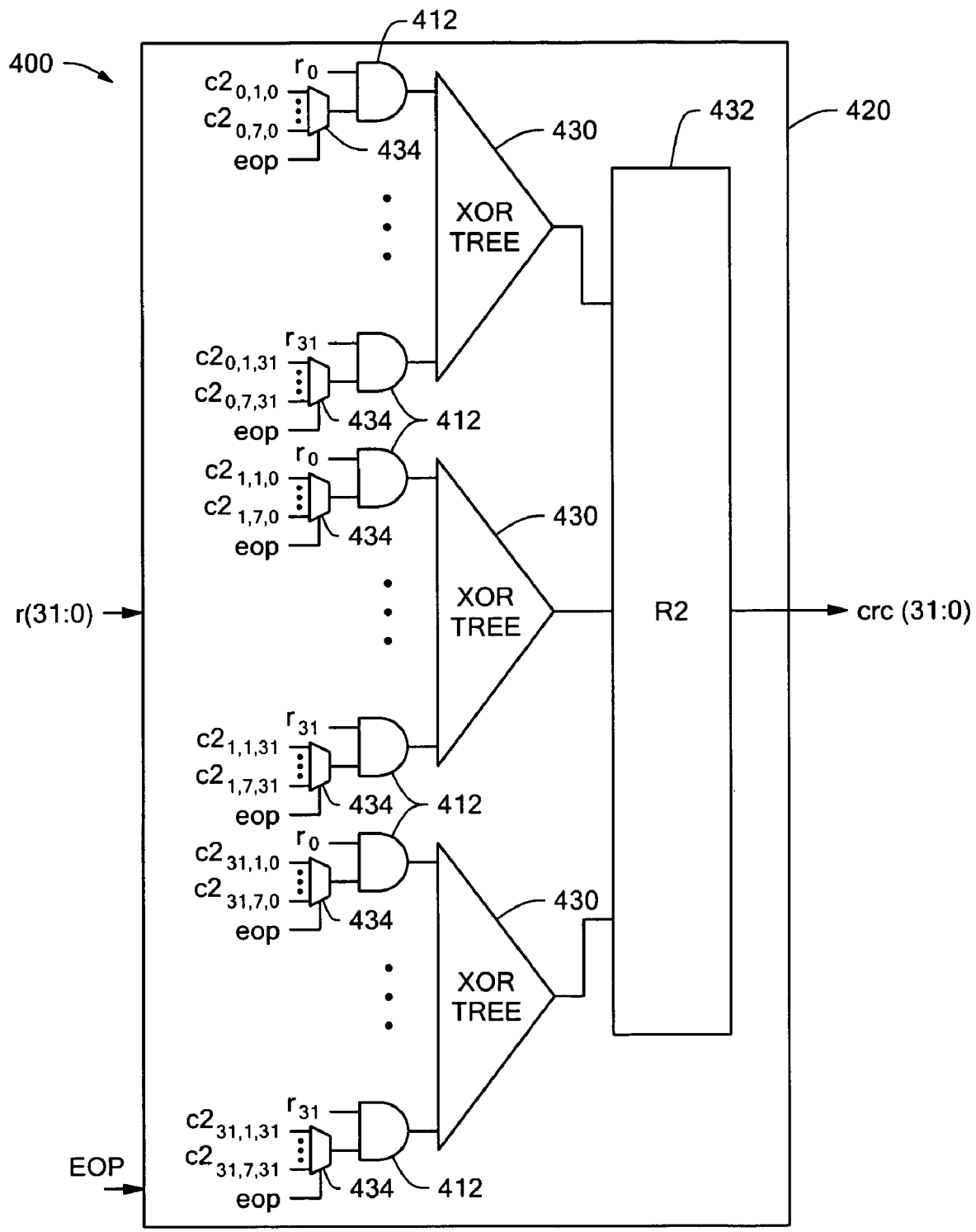

In another embodiment, a programmable CRC calculation engine is provided by way of two stages of XOR trees that permit calculations of any CRC for a configurable number of bits. Referring now to FIGS. 6A and 6B, the programmable CRC calculation engine 400 is shown.

The engine 400 is configured by setting a set of c1 configuration bits and c2 configuration bits to zero or one depending on the polynomial and data-path width to be implemented. The engine comprises first and second stages 410, 420 each stage having a plurality of gates 412, an XOR tree 430 and a register 432. The first stage 410 also includes a buffer 436 for an end of packet (EOP) signal, and the second stage 420 includes a plurality of multiplexors 434 coupled to the gates 412. The first stage 410 applies the XOR function to all bits in the data-path including the unused bits at the end of a packet which have been previously set to zero. The second stage 420 corrects the value at the end of each packet by applying different correction configurations by way of the set of c2 configuration bits and the multiplexors depending on the number of bits in the last word of a packet. The functions for the second XOR tree 430 are obtained by calculating backward the state of the Linear Feedback Shift Register (LFSR) shown for example on FIG. 7A with the understanding that zeroes have been injected as data.

A number of configuration bits are saved by setting unused data bits at the end of a packet to zero and correcting the CRC value with the second stage 420 instead of having as many configurable XOR trees as possible for the number of bytes in the last word of a packet.

Figure 7A:
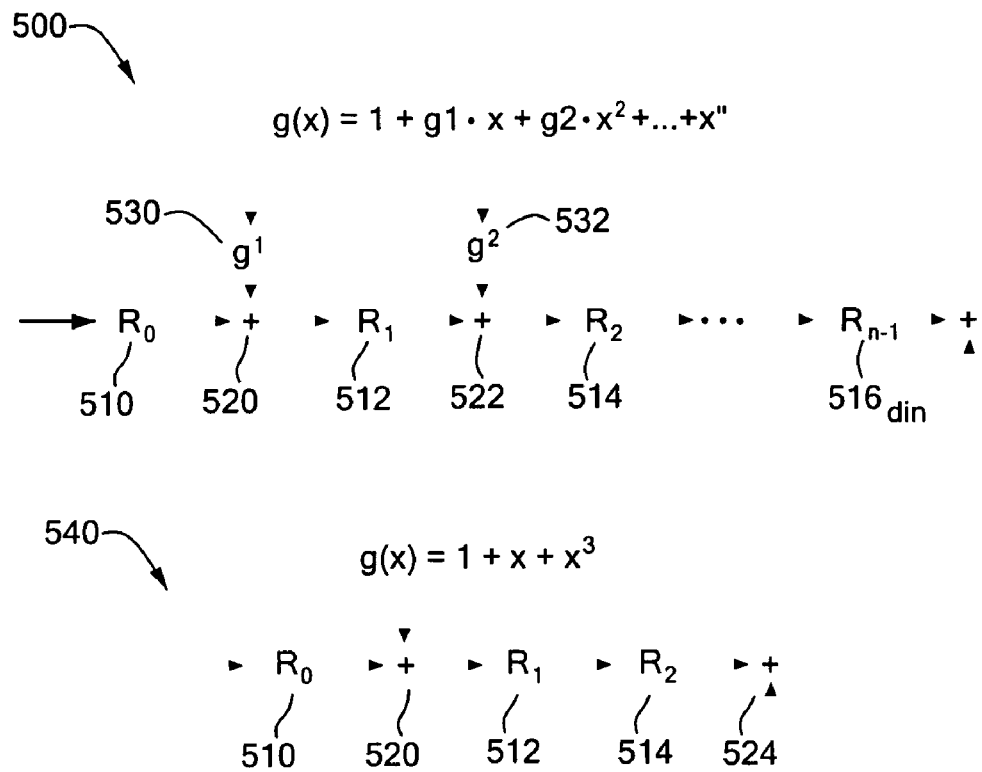
FIG. 7A is a diagram of a prior art Linear Feedback Shift Register used to perform CRC calculations.

Referring now also to FIG. 7A, a prior art linear feedback shift register implementation 500 of a CRC engine is shown. The square boxes (510, 512, 514 and 516) represent storage elements, the circles with the addition sign inside (520, 522 and 524) perform addition modulo 2 (usually implemented with an XOR gate) and the circles with the coefficient name inside represent multiplication by the coefficient (as the coefficients are known once the polynomial is known, these circles are not part of a particular implementation). At every clock cycle one data bit (din) is input to the circuit and after all data bits have been entered, the result of the calculation is stored in the memory elements. The circuit 500 needs N clock cycles to calculate a CRC for a packet of N bits of data (din).

A simplified 4-bit LFSR circuit 540 is shown for purposes of explanation. In this circuit 540, if the input data is 1101 the initial state of R is $R_2(0)=1$, $R_1(0)=1$, $R_0(0)=1$ after 1 cycle (din=1) the result will be:

$$R_2(1)=1, R_1(1)=1 R_0(1)=0$$

After 2 clock cycles (din=1):

$$R_2(1)=1, R_1(1)=0, R_0(1)=0$$

After 3 clock cycles (din=0):

$$R_2(1)=0, R_1(1)=1, R_0(1)=1$$

After 4 clock cycles (din=1):

$$R_2(1)=1, R_1(1)=0, R_0(1)=1$$

In order to increase the speed of the CRC operation, it is desirable to parallelize the circuit of FIG. 7A to calculate the CRC N bits at a time.

Equations can be developed that will give the state of $R_0$, $R_1$ and $R_2$ as a function of the initial state (before processing the N bits) and the N bits of input data. The equations are derived by doing k substitutions in the equations for the serial case.

If $R_1(0)$, $R_2(0)$ and $R_3(0)$ are the initial state, then from the serial circuit we have:

After one cycle (t=1):

$$R_0(1)=din(0) xor R_2(0)$$

$$R_1(1)=din(0) xor R_2(0) xor R_0(0)$$

$$R_2(1)=R_1(0)$$

After two cycles (t=2):

$$R_0(2)=din(1) xor R_2(1)=din(1) xor R_1(0)$$

$$R_1(2)=din(1) xor R_2(1) xor R_0(1)=din(1) xor R_1(0) xor din(0) xor R_2(0)$$

$$R_2(2)=R_1(1)=din(0) xor R_2(0) xor R_0(0)$$

After three cycles (t=3):

$$R_0(3)=din(2) xor R_2(2)=din(2) xor din(0) xor R_2(0) xor R_0(0)$$

$$R_1(3)=din(2) xor R_2(2) xor R_0(2)=din(2) xor din(0) xor R_2(0) xor R_0(0) xor din(1) xor R_1(0)$$

$$R_2(3)=R_1(2)=din(1) xor R_1(0) xor din(0) xor R_2(0)$$

After four cycles (t=4)

$$R_0(4)=din(3) xor R_2(3)=din(3) xor din(1) xor R_1(0) xor din(0) xor R_2(0)$$

$$R_1(4)=din(3) xor R_2(3) xor R_0(3)=din(3) xor din(1) xor R_1(0) xor din(0) xor R_2(0) xor din(2) xor din(0) xor R_2(0) xor R_0(0)=din(3) xor din(1) xor R_1(0) xor din(0) xor din(2) xor din(0) xor R_0(0)$$

Note that $R_2(0)$, as it appears twice, cancels itself out of the equation.

$$R_2(4)=R_1(3)=din(2) xor din(0) xor R_2(0) xor R_0(0) xor din(1) xor R_1(0)$$

Thus, equations are derived for each of the R bits (CRC bits) that are exclusive or (XOR) operations (or module 2 addition) of the initial state of the R bits (state in previous cycle) and all the data bits that will be processed in each cycle (din(0) . . . din(1)).

When the same input data (din(0)=1; din(1)=1; din(2)=0; din(3)=1) and initial state to the equations (111) is applied the result is:

$$R_2(4)=din(2) xor\ din(0) xor\ R_2(0) xor\ R_0(0) xor\ din(1)$$
$$xor\ R_1(0)=0\ xor\ 1\ xor\ 1\ xor\ 1\ xor\ 1=1$$

$$R_1(4)=din(3) xor\ din(1) xor\ R_1(0) xor\ din(0) xor\ din(2)$$
$$xor\ din(0) xor\ R_0(0)=1\ xor\ 1\ xor\ 1\ xor\ 1\ xor\ 0$$
$$xor\ 1\ xor\ 1=0$$

$$R_0(4)=din(3) xor\ din(1) xor\ R_1(0) xor\ din(0) xor\ R_2(0)$$
$$=1\ xor\ 1\ xor\ 1\ xor\ 1=1$$

Figure 7B:
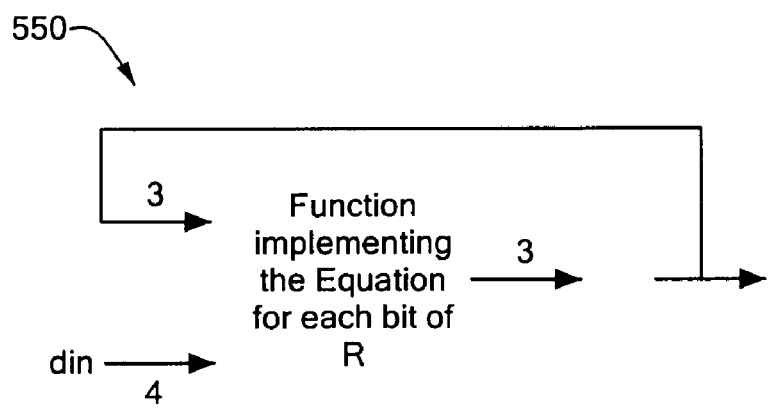
FIG. 7B is a block diagram of a prior art single stage CRC calculation engine.

This polynomial can be implemented in a circuit 550 as shown in FIG. 7B. The equations are implemented as trees of XOR gates since the exclusive or operation has commutative and associative properties (order in which the inputs are processed doesn't matter).

Referring again to FIGS. 6A and 6B, the programmable implementation of the CRC calculation engine includes a circuit for each bit of R that calculates the exclusive or (mod 2 addition) for all the possible inputs in this kind of equation: all the bits in the initial R register and all the input data bits needed to process each cycle. Once this generic tree is derived, the tree can be "programmed" to perform the calculation for a particular polynomial by setting to zero the inputs that don't appear in the equation of that particular polynomial.

For example, for bit 0 of the remainder R the programmable equation would be:

$$R_0(4)=(C1_{0,0} \& din(0)) xor(C1_{0,1} \& din)(1)) xor$$
$$(C1_{0,2} \& din(2)) xor(C1_{0,3} \& din(3)) xor(C1_{0,4} \& R_0$$
$$(0)) xor(C1_{0,5} \& R_1(0)) xor(C1_{0,6} \& R_2(0));\ where\ \&$$
$$is\ a\ logical\ "AND"\ operation.$$

The 4 in $R_o(4)$ refers to the number of bits being processed. It also reflects the number of cycles that a serial implementation would be required to execute. In $C1_{a,b}$, the a refers to the XOR tree number while the b refers to the input bit number. In the above example there are four input data bits (0 to 3) and three CRC register bits (R0 to R3) for a total of seven bits (0 to 6) as inputs for each XOR tree.

In certain cases a packet may require more than one cycle to be processed. In this case, the first stage captures the partially calculated CRC until the last word of the packet is processed, then the second stage provides the final result.

In order to configure the circuitry to perform the equation for the polynomial example, the first stage configuration bits are:

$$R_0(4)=din(3) xor\ R_2(3)=din(3) xor\ din(1) xor\ R_1(0) xor$$
$$din(0) xor\ R_2(0)$$

$C1_{0,0}$=1; (din(0) is in the equation)
$C1_{0,1}$=1; (din(1) is in the equation)
$C1_{0,2}$=0; (din(2) is not in the equation)
$C1_{0,3}$=1; (din(3) is in the equation)
$C1_{0,4}$=0; ($R_0$ is in equation)
$C1_{0,5}$=1; ($R_1$ is in equation)
$C1_{0,6}$=1; ($R_2$ is in equation)

By calculating C for all other bits of R, the first stage is programmed.

The second stage 420 is required to deal with the scenario where packets are not a multiple of N (N being the number of bits being processed each cycle). In this case some preprocessing is performed such that the trailing bits at the end of the packet are set to zeros (alternately, the process can be done setting the trailing bits to ones). The second stage allows the determination of the state of R before these extra zeros where added and calculated into the interim CRC.

The equation is calculated for the state of R before processing an additional zero from its state after processing this zero. In other words, the objective is to calculate the state of the CRC register before processing the unused bits (which have been set to zeroes). This is determined from the current register value and knowing that the unused input data bits have been set to zeroes.

The following example shows that equations which give the state of the register at time 0, knowing what the state of the register is at time 1 and that the data processed has been set to a zero.

For the polynomial example:

$$R_2(0)=0\ xor\ R_0(1)=R_0(1)$$

$$R_1(0)=R_2(1)$$

$$R_0(0)=0\ xor\ R_0(1) xor\ R_1(1)=R_0(1) xor\ R_1(1)$$

In the same way, the equation can be calculated for R(0) from R(2) (two cycles back taken into account that the input bits have been 0) and R(0) from R(3) (three cycles back). In the below example, for $C2_{a,b,c}$ the a represents the output bit number (from register R2), the b represents the number of bits that were unused and the c represents the input bit in each XOR tree in stage 2.

$C2_{0,1,0}$ would be set to one if $R_0(1)$ appears in the equation that calculates $R_0(0)$ going back one data bit.
$C2_{0,1,1}$ would be set to one if $R_1(1)$ appears in the equation that calculates $R_0(0)$ going back one data bit.
$C2_{0,1,2}$ would be set to one if $R_2(1)$ appears in the equation that calculates $R_0(0)$ going back one data bit.
$C2_{0,2,0}$ would be set to one if $R_0(2)$ appears in the equation that calculates $R_0(0)$ going back two data bits.
$C2_{0,2,1}$ would be set to one if $R_1(2)$ appears in the equation that calculates $R_0(0)$ going back two data bits.
$C2_{0,2,2}$ would be set to one if $R_2(2)$ appears in the equation that calculates $R_0(0)$ going back two data bits.
$C2_{0,3,0}$ would be set to one if $R_0(2)$ appears in the equation that calculates $R_0(0)$ going back three data bits.
$C2_{0,3,1}$ would be set to one if $R_1(2)$ appears in the equation that calculates $R_0(0)$ going back three data bits.
$C2_{0,3,2}$ would be set to one if $R_2(2)$ appears in the equation that calculates $R_0(0)$ going back three data bits.

In the same way $C2_{1,X,X}$ would be calculated according to the equations that calculate $R_1(0)$ for going back 1, 2 or 3 data bits and $C2_{2,X,X}$ would be calculated according to the equations that calculate $R_1(0)$ for going back 1, 2 or 3 data bits.

Depending on the end-of-packet position (EOP), one of the configurations (for 1 data bit back, 2 or 3) is chosen. This is implemented in hardware by the use of multiplexors 434. In the case where no correction is necessary (when the packet is a multiple of N bits), the equations could be hardwired (no configuration bits necessary).

The programmable CRC calculation engine allows an end of packet to happen at any bit boundary, however a typical scenario is for end of packet to happen at a byte boundary.

Figure 8:
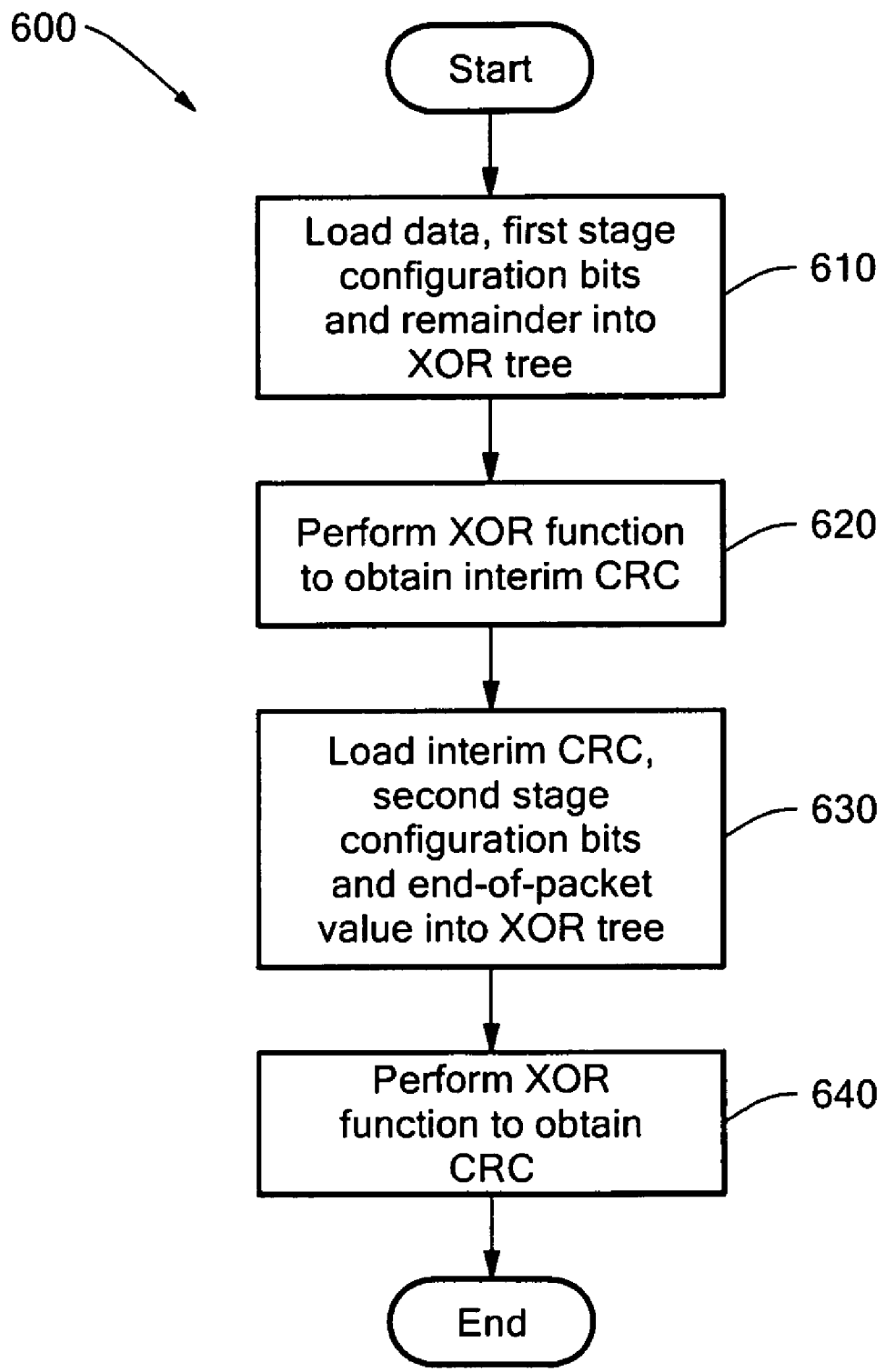
FIG. 8 is a flow diagram of a method of performing CRC calculations using the two-stage programmable CRC engine of FIGS. 6A and 6B.

Referring now to FIG. 8, a flow diagram of the process of using a configurable CRC engine to determine a CRC value for a given set of data and polynomial is shown. The process 600 starts and processing block 610 is executed wherein the data, first stage configuration bits and any remainder are loaded into the first stage XOR tree. The configuration bits take into account the polynomial and the size of the data in order to program the XOR tree as desired.

In processing block 620 the XOR functions are performed, resulting in an interim CRC value. This interim CRC value is not the correct CRC value for the data, as it calculated the CRC based on the entire length of the packet, including any padding that may have been added to the end of the packet.

The second stage of the engine is loaded with the interim CRC value in processing block 630. Also loaded into the second stage are the second stage configuration bits and an end of packet (EOP) signal.

In processing block 640 the XOR functions are performed, resulting in the correct CRC value being provided at the output. The interim CRC value has been corrected such that the CRC calculation does not include any padding bits, and thus is correct for the data.

Having described particular embodiments of the configurable CRC calculation engine included as part of a network processor, it will now become apparent to those of ordinary skill in the art that other embodiments incorporating these concepts may be used. Accordingly, it is submitted that that the configurable CRC calculation engine included as part of a network processor should not be limited to the described embodiments but rather should be limited only by the spirit and scope of the appended claims.

What is claimed is:

1. A configurable cyclic redundancy check (CRC) calculation engine comprising:
    a CRC unit;
    at least one polynomial storage device to provide a polynomial to the CRC unit;
    at least one residue storage device to provide a residue to the CRC unit, wherein the CRC unit is adapted to determine a CRC value for received data using said polynomial and the residue; and
    an input random access memory (RAM) coupled to the CRC unit and the at least one polynomial storage, the RAM input being configured to provide the polynomial to the at least one polynomial storage.

2. The configurable CRC calculation engine of claim 1 wherein said CRC unit is adapted to write said CRC value into said residue storage device.

3. The configurable CRC calculation engine of claim 1 wherein said configurable CRC calculation engine includes a plurality of processing contexts, each of said plurality of processing contexts corresponding to one of said at least one polynomial storage device and to one of said at least one residue storage device.

4. The configurable CRC calculation engine of claim 1 wherein said at least one polynomial storage device is loaded at initialization time.

5. The configurable CRC calculation engine of claim 1 wherein said at least one polynomial storage device is loaded for each new packet of data.

6. A method of determining a cyclic redundancy check (CRC) value comprising:
    receiving a polynomial associated with a packet of data;
    receiving a residue associated with the packet of data provided by a CRC calculation engine;
    receiving a block of data, said block of data comprising a portion of said packet;
    determining a CRC value, using the CRC calculation engine, for the block of data using said polynomial and said residue; and
    storing the CRC value.

7. The method of claim 6 wherein said block of data comprises a part of a packet of data and wherein said method further comprises determining whether there are remaining blocks of data for the packet and when there are remaining blocks of data for the packet then loading the next block of data for the packet and calculating a CRC value for said next block of data.

8. The method of claim 7 wherein said determining a CRC value for said next block of data includes using a residue from a CRC calculation for a prior block of data.

9. The method of claim 6 wherein said receiving a polynomial further comprises initializing a residue to zero.

10. The method of claim 6 wherein an initial non-zero value is loaded into the residue.

11. The method of claim 6 wherein said loading a polynomial into a context is done at initialization time.

12. The method of claim 6 wherein said loading a polynomial into a context is done for a new packet of data.

13. A cyclic redundancy check (CRC) calculation engine comprising:
    an input data storage unit having a plurality of outputs;
    a polynomial storage device having an output;
    a plurality of single data bit processors coupled together serially and coupled to a respective one of said input data storage unit plurality of outputs and to said polynomial storage device output; and
    a remainder storage element coupled to a first one of the plurality of single data bit processors and configured to provide a residue to the first one of the single bit data processors.

14. The CRC calculation engine of claim 13 wherein the first one of the single data bit processors is configured to operate on a least significant bit (LSB) of data stored in the input data storage unit.

15. The CRC calculation engine of claim 14 wherein the remainder storage element is coupled to a second one of the plurality of single data bit processors and configured to receive the residue from the second one of the single data bit processors.

16. The CRC calculation engine of claim 13 wherein each of said single data bit processors performs an exclusive or function.

17. A programmable CRC calculation engine comprising:
    a first stage adapted to receive data and first stage configuration bits, and to determine an interim CRC value; and
    a second stage coupled to said first stage, said second stage adapted to receive said interim CRC value, second stage configuration bits and an end of data signal and to determine a CRC value for said data.

18. The programmable CRC engine of claim 17 wherein said first stage comprises:
    a plurality of AND gates:
    at least one XOR tree having at least one input coupled to an output of at least one AND gate; and
    a register having at least one input coupled to at least one output of said at least one XOR tree.

19. The programmable CRC engine of claim 17 wherein said second stage comprises:
    a plurality of AND gates;
    at least one XOR tree having at least one input coupled to an output of at least one AND gate; and
    a register having at least one input coupled to at least one output of said at least one XOR tree.

20. The programmable CRC engine of claim 19 wherein said second stage further comprises at least one multiplexor coupled to an input of at least one AND gate, said at least one multiplexor having an input coupled to said end of data signal.

21. A method of calculating a CRC value comprising:
   determining a first XOR tree;
   loading data, a remainder and first stage configuration bits into said first XOR tree;
   calculating an interim CRC value with said first XOR tree;
   determining a second XOR tree;
   loading said interim CRC value, an end of data value and second stage configuration bits into said second XOR tree;
   calculating a CRC value for said data with said second XOR tree.

22. The method of claim 21 further comprising determining said first stage configuration bits.

23. The method of claim 22 wherein determining said first stage configuration bits comprises setting corresponding first stage configuration bits to zero that don't appear in a polynomial used with said data to determine said CRC.

24. The method of claim 21 further comprising determining said second stage configuration bits.

25. The method of claim 21 wherein said determining a first XOR tree comprises deriving said first XOR tree from said remainder, said first stage configuration bits and said data.

26. The method of claim 25 wherein said deriving said first XOR tree includes providing an XOR function for each bit of said remainder and said data and for the first stage configuration bits and said data.

27. The method of claim 21 wherein said determining said second XOR tree comprises deriving an XOR tree from said interim CRC value and said second stage configuration bits.

28. The method of claim 27 said deriving said second XOR tree includes providing an XOR function for each bit of said remainder and a predetermined set of said second stage configuration bits.

29. The method of claim 28 wherein said predetermined set of second stage configuration bits is determined from said end of data value.

* * * * *